US006909229B2

United States Patent
Yazawa

(10) Patent No.: US 6,909,229 B2
(45) Date of Patent: Jun. 21, 2005

(54) ORGANIC EL DISPLAY

(75) Inventor: Naoki Yazawa, Yamagata (JP)

(73) Assignee: Tohoku Pioneer Corporation, Yamagata (JP)

( * ) Notice: Subject to any disclaimer, the term of this patent is extended or adjusted under 35 U.S.C. 154(b) by 107 days.

(21) Appl. No.: 10/035,165

(22) Filed: Jan. 4, 2002

(65) Prior Publication Data

US 2002/0089281 A1 Jul. 11, 2002

(30) Foreign Application Priority Data

Jan. 11, 2001 (JP) ..................................... P. 2001-003410

(51) Int. Cl.[7] .............................................. H05B 33/00
(52) U.S. Cl. ........................ 313/504; 313/506; 313/112
(58) Field of Search ......................... 313/504, 506–509, 313/498; 349/11; 345/76; 315/169.3; 347/113, 106, 143, 182, 183

(56) References Cited

U.S. PATENT DOCUMENTS

| 4,590,128 A | * | 5/1986 | Kawai ..................... 428/411.1 |
| 5,343,050 A | * | 8/1994 | Egusa et al. ................... 257/40 |
| 5,841,230 A | * | 11/1998 | Ikoma et al. ................ 313/506 |
| 5,949,187 A | * | 9/1999 | Xu et al. ...................... 313/504 |
| 6,091,382 A | * | 7/2000 | Shioya et al. .................. 345/76 |
| 6,259,423 B1 | * | 7/2001 | Tokito et al. .................. 345/76 |
| 6,303,255 B1 | * | 10/2001 | Sakaguchi et al. ............. 430/97 |
| 6,324,011 B1 | * | 11/2001 | Higuchi ....................... 359/627 |
| 6,515,417 B1 | * | 2/2003 | Duggal et al. ............... 313/506 |
| 6,517,957 B1 | * | 2/2003 | Senoo et al. ................. 428/690 |
| 6,529,255 B1 | * | 3/2003 | Sekiguchi .................... 349/113 |

* cited by examiner

Primary Examiner—Ashok Patel
(74) Attorney, Agent, or Firm—Sughrue Mion, PLLC

(57) ABSTRACT

An organic EL display includes a transparent electrode 2, an organic EL layer 3, 4, and a back electrode 5 sequentially stacked on a transparent substrate 1. A half mirror 6 is disposed on the outer surface of the transparent substrate 1. A thin metal film is formed as the half mirror 6 by vapor-depositing or sputtering one of metals such as Al, Ag, Sn and Cr and a compound such as $TiO_2$ or several of the metals and compound on the outer surface of the transparent substrate 1. A transparent resin film on which a thin metal film is formed, or the like is used.

6 Claims, 1 Drawing Sheet

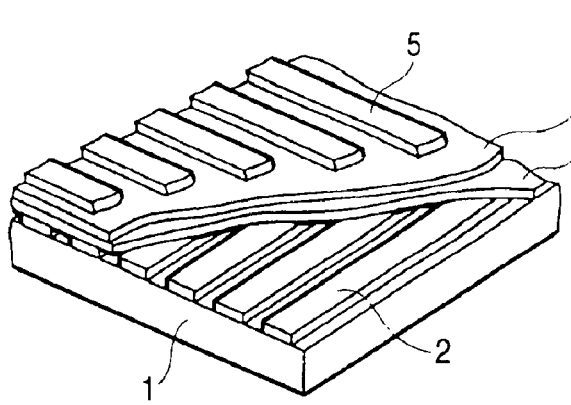
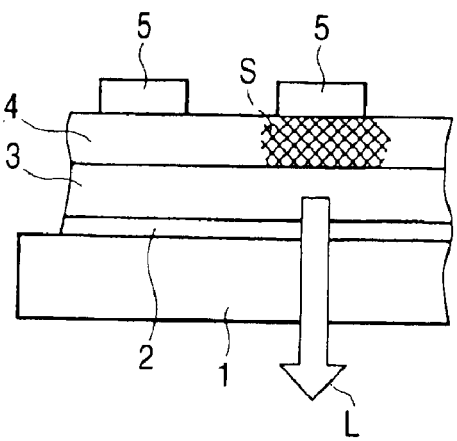
FIG. 1A
FIG. 1B
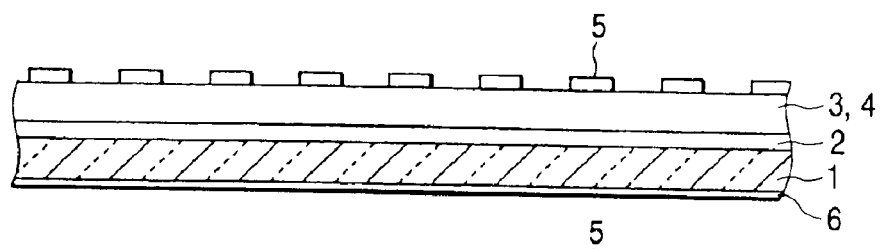
FIG. 2A
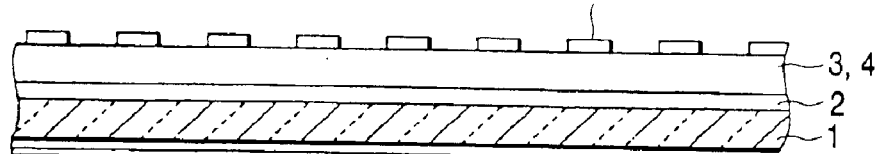
FIG. 2B
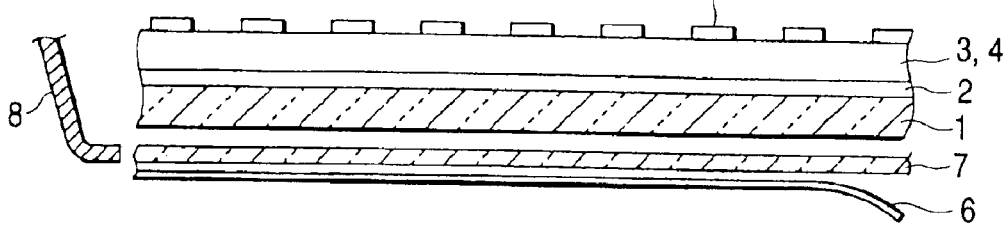
FIG. 2C
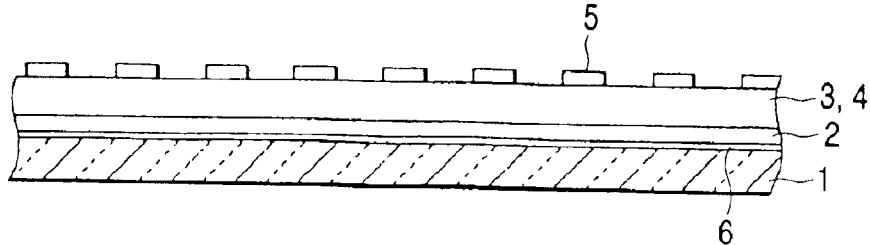
FIG. 3

ORGANIC EL DISPLAY

BACKGROUND OF THE INVENTION

1. Field of the Invention

The present invention relates to an organic electroluminescent (EL) display in which contrast reduction due to external light is prevented from occurring, and which is suitable for displaying an image that produces a sense of depth.

2. Description of the Related Art

In an organic EL display, an image is displayed by means of spontaneous light which is generated by applying a voltage to a luminescent layer, and therefore is brighter and clearer than that obtained in a liquid crystal display that requires a back light, and not susceptible to a viewing angle. Because of these advantages, attention is focused on an organic EL display as a next-generation display device.

An organic EL display has a standard structure in which a carrier transporting layer 3 and an organic luminescent layer 4 are stacked on a stripe-like transparent electrode 2 on a transparent substrate 1, and a stripe-like back electrode 5 is placed so as to perpendicularly cross the transparent electrode 2. Also a single-layer light emitting device is known in which an electron-injecting layer is additionally deposited on the organic luminescent layer 4 on the side of the back electrode 5, or organic illuminants are dispersed.

When a data signal of a positive voltage and a scan signal of a negative voltage are supplied at independent timings to the transparent substrate 1 and the back electrode 5, holes and electrons are injected into the organic luminescent layer 4 from the transparent electrode 2 and the back electrode 5. In the organic luminescent layer 4, the holes and the electrons are recombined (S) to excite an organic illuminant corresponding to a specific pixel. An object image is displayed by luminescence L transmitted through the transparent substrate 1.

When an image displayed on an organic EL display is observed, also external light reflected by the back electrode 5 simultaneously comes in sight. This mixture of external light which adversely affects the contrast and distinction of a displayed image can be prevented from occurring, by sticking a polarizing plate onto the organic EL display to restrict reflected light of external light. However, this countermeasure requires a polarizing plate that is generally expensive, and therefore the production cost of a resulting organic EL display is high. Moreover, the sticking of a polarizing plate causes the organic EL display to be flattened, and a displayed image tends to become a flat image which scarcely produces a sense of depth.

SUMMARY OF THE INVENTION

The invention has been conducted in order to solve the problems. It is an object of the invention to provide an organic EL display in which a half mirror is disposed to restrict the amount and direction of reflection of external light, so that the organic EL display can display a high visibility image which produces a sense of depth.

In order to attain the object, the organic EL display of the invention is an organic EL display in which a transparent electrode, an organic EL layer, and a back electrode are sequentially stacked on a transparent substrate, wherein a half mirror is disposed on the outer surface of the transparent substrate.

As a half mirror 6, a thin film which is formed by vapor deposition, sputtering, or the like on the outer surface of a transparent substrate 1, and which contains one of metals such as Al, Ag, Sn and Cr and a compound such as $TiO_2$ or several of the metals and compound may be used. Alternatively, a transparent resin film in which a thin metal film is formed may be stuck to the transparent substrate so as to be used as the half mirror.

BRIEF DESCRIPTION OF THE DRAWINGS

FIGS. 1A and 1B are views showing a layer structure and luminescence of an organic EL element.

FIGS. 2A to 2C are views showing two examples of the organic EL display of the invention.

FIG. 3 is a view showing a conventional organic EL display in which a half mirror is disposed on an inner surface of a transparent substrate.

DETAILED DESCRIPTION OF THE PRESENT INVENTION

In an organic EL display according to the invention, a half mirror 6 is stacked on the outer surface or the inner surface of a transparent substrate 1 (FIGS. 2A to 2C). The invention can be applied to an organic EL element of any kind including the illustrated two-layer structure configured by a carrier transporting layer 3 and an organic luminescent layer 4, and also a three-layer structure configured by the carrier transporting layer 3, the organic luminescent layer 4, and an electron-injecting layer, and a single-layer in which organic illuminants are dispersed. The driving system may be either of the active type or the passive type.

The half mirror 6 can be configured by depositing a thin film containing one of metals such as Al, Ag, Sn and Cr and a compound such as $TiO_2$ or several of the metals and compound on the outer surface of the transparent substrate 1 by vapor deposition, sputtering, or the like method (FIG. 2A), or by sticking a resin film on which a thin metal film is vapor-deposited is stuck onto the outer surface of the transparent substrate 1 (FIG. 2B). Alternatively, such a film may be stuck to a transparent protective plate 7 which is attached to a case 8 of an apparatus, and which is made of glass, plastic, or the like, instead of the direct sticking to the surface of the transparent substrate 1 (FIG. 2C).

Alternatively, the resin film on which a thin metal film is vapor-deposited may be separated from the transparent substrate 1 so as to maintain a gap between the film and the transparent substrate 1. FIGS. 2A to 2C show a state in which the half mirror 6 is placed as the outermost surface. In an actual organic EL display, however, a protective film is stuck onto the half mirror 6 as required.

The amount and direction of reflection of external light are restricted by the half mirror 6, so that luminescence L of the organic EL display is viewed as a high contrast image. The direct luminescence from the organic EL display, and an image which is reflected several times between the half mirror 6 and the back electrode 5 overlap with each other. Therefore, an image which produces a good sense of depth can be displayed, and the sense of depth of an image can be adjusted by changing the thickness of the transparent substrate 1. In order to display an image which produces a sense of depth at a required degree, preferably, the distance from the organic EL layer 3, 4 to the half mirror 6 is set to be equal to or larger than the dot pitch of the organic EL display (when the dot pitch is 0.3 mm, for example, the distance is 0.3 mm or more).

An image which produces a sense of depth can be obtained only by the configuration in which the half mirror 6 is disposed on the outer surface of the transparent substrate 1. In an organic EL display in which the half mirror 6 is disposed on the side of the organic EL element (FIG. 3: JP-A-8-94811), for example, a displayed image is viewed on a flat face, and therefore would not be distinct from images obtained in a liquid crystal display and the like.

Since a high visibility image which produces a sense of depth can be obtained without requiring a polarizing plate that is generally expensive, an organic EL display of high quality can be economically provided.

As described above, in the organic EL display of the invention, since a half mirror is disposed on an outer surface of a transparent substrate, a high contrast image which produces a sense of depth can be displayed. Therefore, the organic EL display can be used as a display device which is excellent in design and produces a sense of high grade as compared with a liquid crystal display or the like in which a flat image is displayed.

What is claimed is:

1. An organic electroluminescent display comprising:
   a transparent substrate having an inner surface and an outer surface;
   a transparent electrode disposed on the inner surface of the transparent substrate;
   an organic EL layer disposed on the transparent electrode;
   a back electrode disposed on the organic EL layer; and
   a half mirror disposed on the outer surface of the transparent substrate and at a distance from the organic EL layer to display an image that produces a sense of depth,
   wherein the transparent electrode is in direct contact with the organic EL layer.

2. The organic electroluminescent display according to claim 1, wherein the half mirror is formed of a thin metal film on the outer surface of the transparent substrate or a surface of a transparent plate that protects the organic electroluminescent display.

3. The organic electroluminescent display according to claim 1, wherein the half mirror is formed of a transparent resin film having a thin metal film, the transparent resin film attached to the transparent substrate or a transparent plate that protects the organic electroluminescent display.

4. The organic electroluminescent display according to claim 1, wherein a perpendicular distance from a surface of the organic EL layer to the half mirror is equal to or larger than a dot pitch of the display.

5. The organic electroluminescent display according to claim 2, wherein a perpendicular distance from a surface of the organic EL layer to the half mirror is equal to or larger than a dot pitch of the display.

6. The organic electroluminescent display according to claim 3, wherein a perpendicular distance from a surface of the organic EL layer to the half mirror is equal to or larger than a dot pitch of the display.

* * * * *